ized Patent [19]

United States Patent [19]
Ueno et al.

[11] Patent Number: 4,860,243
[45] Date of Patent: Aug. 22, 1989

[54] FUZZY LOGIC SEMIFINISHED INTEGRATED CIRCUIT

[75] Inventors: Fumio Ueno; Takeshi Yamakawa, both of Nishigoshi; Yuji Shirai, Yatsushiro, all of Japan

[73] Assignee: Omron Tateisi Electronics Co., Kyoto, Japan

[21] Appl. No.: 41,696

[22] Filed: Apr. 23, 1987

Related U.S. Application Data

[62] Division of Ser. No. 714,809, Mar. 22, 1985, Pat. No. 4,694,418.

[30] Foreign Application Priority Data

| Mar. 23, 1987 | [JP] | Japan | 62-57122 |
| Mar. 23, 1987 | [JP] | Japan | 62-57123 |
| Mar. 23, 1987 | [JP] | Japan | 62-57124 |
| Mar. 23, 1987 | [JP] | Japan | 62-57125 |

[51] Int. Cl.$^4$ .................. G06G 7/00; G06F 15/48
[52] U.S. Cl. ............................. 364/807; 361/414; 361/412
[58] Field of Search ........... 364/807, 801, 800, 600, 364/601, 602, 604; 307/494, 201, 296 R; 361/414, 412, 396

[56] References Cited

U.S. PATENT DOCUMENTS

| 3,323,198 | 6/1967 | Shortes | 361/414 |
| 3,750,476 | 8/1973 | Brown | 361/283 |
| 3,909,597 | 9/1975 | Dunn | 364/601 |
| 3,996,502 | 12/1976 | Bratschun | 361/272 |
| 4,338,527 | 7/1982 | Nagano | 307/494 |
| 4,630,172 | 12/1986 | Stenerson et al. | 361/414 |
| 4,694,418 | 9/1987 | Ueno et al. | 364/807 |

FOREIGN PATENT DOCUMENTS

1293844 4/1969 Fed. Rep. of Germany .

OTHER PUBLICATIONS

IECE of Japan, vol. 63–C, No. 10, pp. 720–721, "Implementation of Fuzzy Logic Hardware Systems—Three Fundamental Arithmetic Circuits", (Oct. 1980), pp. 722–723.
Pp. 724–725, "Construction of a Programmable Multifunction Voltage Mode Fuzzy Logic Circuit".
No. 12, pp. 861–862, (Dec. 1980), "Implementation of a New Analog Multiplier and/or Divider Circuit with Current Mode".
Vol. J64–C, No. 2, pp. 147–148—"Implementation of Fuzzy Logic Circuits and a Programmable Multifunction Circuit with Current Mode".
Denki Kankei Gahhai Kyushu Shibu Rengokai Taikai Ronbunshu, p. 340, (Oct. 14, 1983), "Simplification of Complex Fuzzy Logic Equations and Automatic Designing for Circuit Diagram".
Transactions of the Inst. Electron. & Commun. Eng. of Japan, Part E, vol. E64, No. 2, Feb. 1981; T. Yamakawa et al., "Implementation of Fuzzy Logic Circuits and a Programmable Multifunction Circuit with Current Mode", p. 105 & vol. J64–C, No. 2, pp. 147–148.
Transactions of the Inst. Electron & Commun. Eng. of Japan, Part E, vol. E63, No. 10, Oct. 1980; T. Yamakawa et al., "Implementation of Fuzzy Logic(-Complement, Bounded-Difference, Bounded-Sum and Absolute-Difference) by Current Mode Circuits", p. 790 & vol. J63–C, No. 10, pp. 722–723, T. Yamakawa et al., Construction of a Programmable Multifunction Voltage Mode Fuzzy Logic Circuit.
Transactions of the Inst. Electron. & Commun. Eng. of Japan, Part C, vol. J67C, No. 12, Dec. 1984; T. Yamakawa et al., "Basic Fuzzy Logic Circuit Formed (List continued on next page.)

Primary Examiner—E. A. Goldberg
Assistant Examiner—Mark Reinhart
Attorney, Agent, or Firm—Stevens, Davis, Miller & Mosher

[57] ABSTRACT

A fuzzy logic circuit comprising a current mirror comprising an FET, a first input current source connected to the input side of the current mirror, a second input current source, a wired OR connected at its input side to the output side of the current mirror and to the second input current source, and an output terminal connected to the output side of the wired OR.

9 Claims, 16 Drawing Sheets

OTHER PUBLICATIONS by Using p-MOS Current Mirror Circuits", pp. 1022-1029.

T. Yamakawa, T. Miki and F. Ueno: "Fuzzy Logic Array IC Implemented by the Canonical P-MOS Process", Showa 59 Nendo Denshi Tsushin Gakkai (IECE of Japan) Sogo Zenkoku Taikai Koen Ronbun-Shu, p. 6-85, (Mar. 26, 1984).

Y. Shirai, T. Yamakawa and F. Ueno: "A CAD Oriented Synthesis of Fuzzy Logic Circuits", Trans. IECE of Japan, vol. J67-D, No. 6, (Jun. 1984).

Y. Shirai, T. Yamakawa, T. Inoue and F. Ueno: "Programmable Multifunction Fuzzy Logic Circuit with Voltage Mode", Denki Yon Gakkai Kyushu Shibu Rengokai Taikai Ronbunshu, p. 259, (10/24/80).

Y. Shirai, T. Yamakawa and F. Ueno: "Membership Function (s/z Functions) Circuit of Fuzzy Logic", Denki Yon Gakkai Kyushu Shibu Rengokai Taikai Ronbunshu, p. 286, (10/23/81).

T. Yamakawa, T. Miki and F. Ueno: "The Fuzzy Logic Semi-Custom IC Fabricated by Using the Standard p-MOS Process", Trans. IECE of Japan, vol. J67-C, No. 7, pp. 600-601, (Jul., 1984).

T. Yamakawa, T. Miki and F. Ueno: "Basic Fuzzy Logic Circuit Formed by Using p-MOS Current Mirror Circuits", Trans. IECE of Japan, vol. J67-C, No. 12, pp. 1022-1029, (Dec., 1984).

T. Yamakawa: "CMOS Multi-Valued Arithmetic Logic Circuits in Hybrid Mode", Note on Multiple-Valued Logic in Japan, vol. 3, No. 5, pp. (5-1)-(5-10), (Feb. 1985).

T. Yamakawa, T. Miki and F. Ueno: "The Design and Fabrication of the Current Mode Fuzzy Logic Semi--Custom IC in the Standard CMOS IC Technology", IEEE Proceedings, The Fifteenth International Symposium on Multiple-Valued Logic, pp. 76-82, (May 28, 1985).

Millman, Microelectronics McGraw-Hill, 1979, pp. 242-266, 538-541.

(A)

(B)

(C)

(D)

(A)

(B)

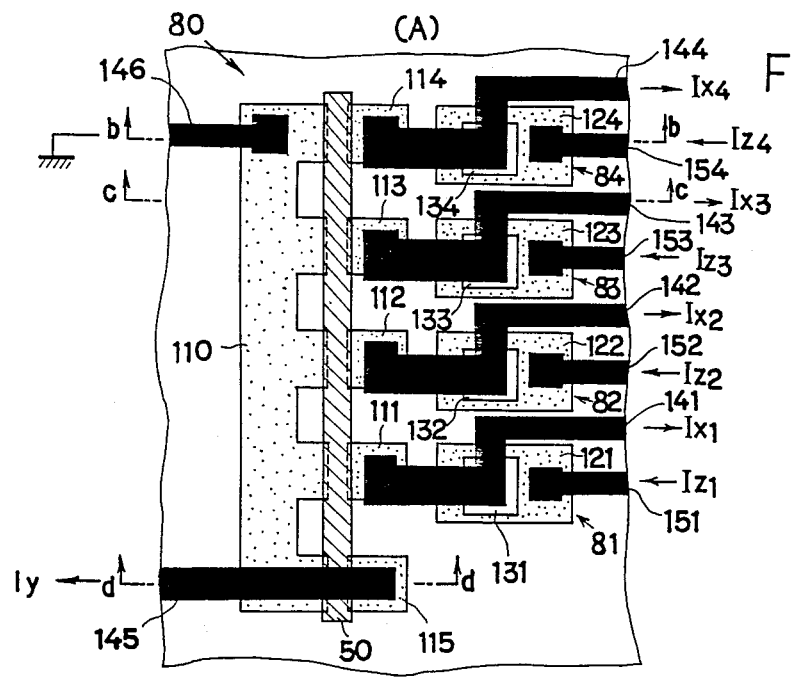
FIG.24
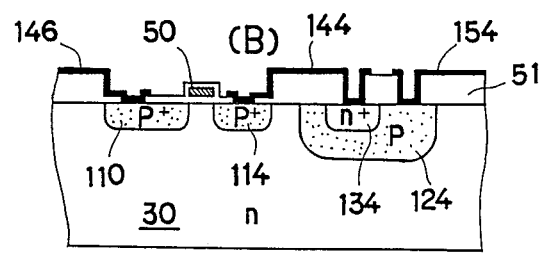
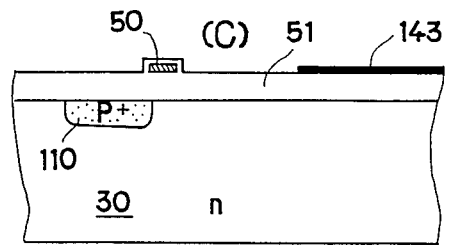
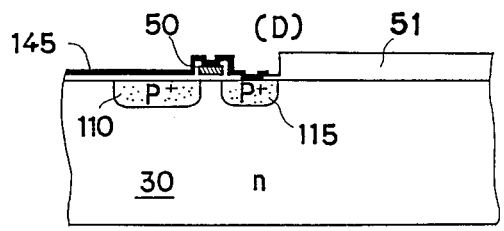

FUZZY LOGIC SEMIFINISHED INTEGRATED CIRCUIT

This is a division of application Ser. No. 714,809 filed Mar. 22, 1985, now U.S. Pat. No. 4,694,418.

BACKGROUND OF THE INVENTION

The present invention relates to fuzzy logic circuits.

The fuzzy logic handles fuzziness. Human thought and behavior involve indefiniteness or vagueness. If such vagueness can be expressed in terms of number or amount or theorized, the result will find application to the design of community systems such as traffic control systems, emergency or applied therapeutic systems and the like and to the design of robots simulating the human being. Ever since the concept of fuzzy sets was proposed by L. A. Zadeh in 1965, research has been conducted on the fuzzy logic as a means for handling "vagueness" from the above viewpoint. However, many research efforts are presently directed to the application of the logic to software systems for use with digital computers. The digital computer is adapted to perform operation based on the binary logic with use of 0 and 1. Although the operation is processed very strictly, there is a need to use an A/D convertor circuit for feeding analog amounts. Accordingly the computer has the problem of requiring a long period of time to obtain the final result by processing a vast quantity of information. The programs for handling the fuzzy logic are bound to become complex and require a large-sized digital computer for complicated processing, hence uneconomical.

Since the fuzzy logic handles continuous values (0, 1) in the section of from 0 to 1, the logic is inherently incompatible with digital computers which operate on the binary logic. Further because the fuzzy logic handles vague amounts having a range, the strictness required thereof is not as high as is required of digital computers. Accordingly, it is desired to provide circuits or systems which are suitable to handle the fuzzy logic.

SUMMARY OF THE INVENTION

The main object of the present invention is to provide basic circuits suited to the handling of fuzzy logic and fuzzy logic integrated circuits useful as bases for systems for handling the fuzzy logic.

More specifically, the pressent invention provides a fuzzy logic circuit which comprises a current mirror comprising an FET, a first input current source connected to the input side of the current mirror, a second input current source, a wired OR connected at its input side to the output side of the current mirror and to the second input current source, and an output terminal connected to the output side of the wired OR.

In principle, a diode which is forward with respect to the direction of output current is provided between the wired OR and the output terminal, but the diode can be dispensed with in a special case as will become apparent later. Stated specifically, various types of input current sources are usable such as one for converting the detection value of a sensor to a current value corresponding to the signal and representing a continuous value (0, 1) from 0 to 1 for use in the fuzzy logic and delivering the current of the value as an output, a source for converting a voltage or current value (whether analog or digital) specified or fed in similarly to a current of corresponding value and delivering the current as an output, and the like. Further when fuzzy logic circuits are connected in cascade, a fuzzy logic circuit will serve as an input current source for the subsequent fuzzy logic circuit. Also useful as the input current source will be one which produces a current corresponding to a predetermined value (e.g. the value 1 in the fuzzy logic). Useful output terminals are not limited to those for wire bonding but include conductors for merely conducting the output current. For example, the concept of the output terminal includes an Al pattern for connecting a fuzzy logic circuit to the next one.

With the fuzzy logic circuit of the present invention, an FET is used for providing the current mirror, so that the mirror constant can be manufactured at 1, assuring an accurate fuzzy logic operation at an increased speed. Further because the circuit operates in current mode, arithmetic summation and arithmetic subtraction can be realized by the wired OR. This serves to render the circuit construction greatly simplified. The fuzzy logic circuit of the invention is a basic circuit (bounded-difference circuit) for various operations according to the fuzzy logic, so that combinations of such circuits permit various kinds of operations and are best suited for giving IC's (integrated circuits).

The current mirror comprising an FET and included in the above circuit may be replaced by a multi-output current mirror, and a plurality of second input current sources may be provided. In this case, a plurality of output terminals of the multi-output current mirror and the plurality of current sources are connected to a plurality of output terminals by a plurality of wired OR's. This provides a fuzzy logic circuit which performs a plurality of operations and gives a plurality of outputs at the same time. As a result, an IC can be fabricated with a reduced number of elements.

The basic operations according to the fuzzy logic include bounded difference, complement, bounded sum, bounded product, logic union, logic intersection, absolute difference, implication and equivalence. We have found that when a bounded-difference circuit is constructed of a current mirror comprising an MOS FET, wired OR and diode and adapted to operate in current mode, circuits for performing all operations other than bounded difference can be realized with use of one or a plurality of such bounded-difference circuits and wired OR's. This means that a desired fuzzy logic circuit can be obtained with use of a multiplicity of bounded-difference circuits already formed on a substrate, merely by changing the wiring pattern.

Accordingly, the present invention further provides a fuzzy logic integrated circuit which comprises a multiplicity of basic circuit elements provided on a base plate and operable in current mode for fuzzy logic, and a thin conductor film or a protective insulating film formed over the entire surface of the base plate. As a rule, the basic circuit element is a pair of current mirror comprising an MOS FET and diode. In some cases, however, the diode preceding the current mirror can be dispensed with, so that it is possible to use a basic circuit element which consists only of a current mirror comprising an MOS FET. In this case, it is possible to provide a circuit for carrying out six basic operations other than logic union, absolute difference and equivalence. When a thin conductor film is formed over the surface of the base plate having the multiplicity of basic circuit elements formed thereon, the conductor film can be utilized to form a suitable conductor wiring pattern thereon. When a protective insulating film is formed over the base plate surface, contact holes are formed at required portions, and a thin conductor film is formed thereover to form a suitable wiring pattern utilizing the film. Consequently, a circuit is obtained for performing the desired fuzzy logic operation. This means that the supplier of fuzzy logic IC's needs only to fabricate exactly identical IC's and that the user of fuzzy logic IC's can prepare an IC of the desired function by a simple work procedure. As a result, it is possible to greatly reduce the time, expenditure and labor needed for the development, trial fabrication and manufacture of fuzzy logic systems.

These and other features of the present invention will become apparent from the following description of embodiments.

BRIEF DESCRIPTION OF THE DRAWINGS

FIGS. 1a, 1b, 1c, 1d show current input-output modes;

FIGS. 24a, 24b, 24c, and 24d shows an IC structure therefor, (A) being a pattern plan view, and (B), (C) and (D) being views in section taken along the line b—b, line c—c and line d—d, respectively, in (A);

FIG. 24 is a diagram showing a logic union circuit including the multi-output bounded-difference circuit;

DESCRIPTION OF THE PREFERRED EMBODIMENTS (1) Current input-output modes in fuzzy logic circuits According to the present invention, the fuzzy logic circuit operates in a current mode. Various current input-output modes will be described briefly. In FIG. 1, the input current of a fuzzy logic circuit 10 is indicated at Ii, and the output current thereof at Io. (A) shows an input-output mode in which the input current I1 flows into the circuit 10 and the output current Io flows out from the circuit 10. Such currents will be referred to as "flow-in input" and "flow-out output." In (B), the input current I1 flows out from the circuit 10, and the output current Io flows into the circuit 10, hence flow-out input and flow-in output. Similarly (C) shows flow-in input and flow-in output, and (D) shows flow-out input and flow-out output. Whe connecting fuzzy logic circuits in cascade, the mode of FIG. 1 (A) or (B) is preferable to use. While FIG. 1 shows examples of single fan-in and single fan-out, like input-output modes are used for multiple fan-in/fan-out circuits.

(2) Basic operations of fuzzy logic

A fuzzy set X is characterized by a membership function $\mu x$. The membership function represents the degree to which a variable thereof belongs to the fuzzy set X. This degree is expressed by a continuous value (0, 1) in the section of from 0 to 1. Accordingly, the membership function can be said to convert the variable to (0, 1). Similarly, a fuzzy set Y is characterized by a membership function $\mu y$.

According to the fuzzy logic, vagueness is expressed by a fuzzy set, whichis used for handling the vagueness of a common logic. The basic fuzzy logic includes bounded difference, complement, bounded sum, bounded product, logic union, logic intersection, absolute difference, implication and equivalence. As will become apparent later, these nine basic operations can be expressed by bounded difference and arithmetic sum. This means that the smallest units of the basic operations of fuzzy logic are bounded difference and arithmetic sum. One of the advantages of circuits which operate in current mode is that the arithmetic summation (arithmetic subtraction also) can be realized by a wired OR.

Circuits for performing the foregoing nine basic operations will be described first, and embodiments of the invention will be described thereafter. As a rule, circuits for carrying out the basic operations are provided by P-channel metal-oxide-semiconductor field-effect transistors (P-MOS FET), and the current mode of flow-out input/flow-in output is used. However, fuzzy logic circuits can be realized also by N-channel MOS FET and complementary MOS FET (N-MOST FET and C-MOS FET).

(3) Bounded-difference circuit

For fuzzy sets X, Y, the bounded difference is defined as follows with use of their membership functions $\mu x$ and $\mu y$.

$$X \ominus Y \rightleftharpoons \mu_{x \ominus y} \qquad (1)$$
$$= \mu x \ominus \mu y$$
$$= 0 V(\mu x - \mu y)$$

wherein $\ominus$ is bounded difference, V is logic union (max) (the greatest should be selected), and − represents arithmetic subtraction. The fuzzy logic does not use negative values, so that when $(\mu x - \mu y)$ in Expression (1) is a negative value, the bounded difference becomes 0 owing to the logic union V. Specifically, Expression (1) represents the following relation.

$$\mu_{x \ominus y} = \begin{cases} \mu x - \mu y & (\mu x > \mu y) \\ 0 & (\mu x \leq \mu y) \end{cases} \qquad (2)$$

Figure 1:
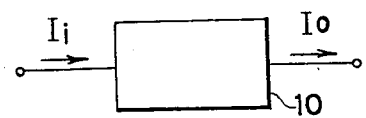
Figure 1:
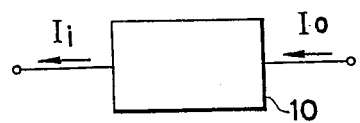
Figure 1:
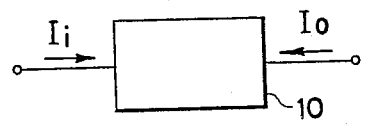
Figure 1:
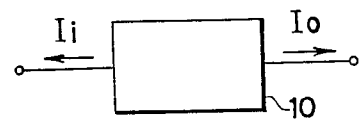
Figure 2:
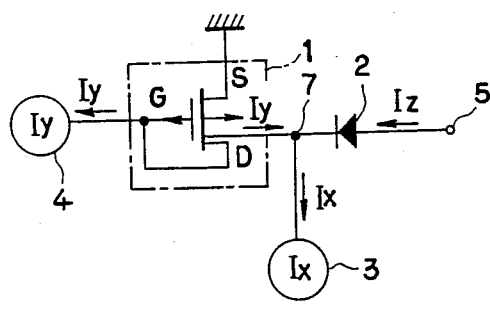
FIG. 2 is a diagram showing a bounded-difference circuit.

FIG. 2 shows a bounded-difference circuit, which comprises a current mirror 1 comprising a P-MOS FET, a wired OR 7, a diode 2, two current sources 3, 4 and an output terminal 5. The current mirror 1, which is shown also in FIG. 4, (A), is equivalent to a current mirror shown in FIG. 4 (B) and comprising two P-MOS FET 11, 12.

Figure 4:
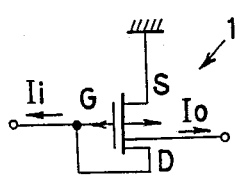
FIGS. 4a and 4b are a circuit diagram of two equivalent current mirrors.
Figure 4:
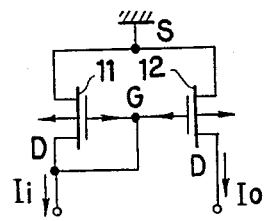

With reference to FIG. 4 (B), the source S of the two FET's 11, 12 is grounded. The gates G thereof are connected together and further connected to the drain D of one FET 11. When a flow-out input Ii is given to the drain D of the FET 11, a flow-out output current Io (=Ii) is obtained from the drain D of the other FET 12. This is because a gate voltage (between the gate and the source S) is applied so that the drain current becomes equal to Ii in the FET 11 and because this gate voltage also acts on the other FET 12 to make the drain current of the FET 12 also equal to Ii, provided that the two FET's 11, 12 are equivalent in structure and Si-SiO$_2$ interface properties. No current flows through the short circuit between the gate G and the drain D of the FET 11.

If the two FETIs are identical in structure and Si-SiO$_2$ interface properties, an output current Io equal to the input current Ii is obtained irrespective of the intensity of the input current. This is a distinct feature of current mirrors comprising an FET. With current mirrors comprising a bipolar element such as a common p-n junction transistor, the relation of Ii=Io is available only when the current amplification factor $\beta$ is very great. If the input current Ii is small, the factor $\beta$ is also small, so that the above relation is not obtained. The current mirror of FIG. 4(B) will hereinafter be referred to by the symbol used in FIG. 4(A).

Referring to FIG. 2 again, when the current source 4 for giving a flow-out input current Iy is connected to the input drain (gate) of the current mirror 1, a flow-out current of equal value Iy is obtained at the output drain, as will be apparent from the above description. Connected by way of the wired OR 7 to the output drain are the current source 3 for giving a flow-out inpt current Ix and the output terminal 5, the latter being so connected via a diode 2 which is backward with respect to the direction of outflow of the mirror. Since the current of value Ix is drawn by the current source 3, an output current of Iz=Ix−Iy flows from the terminal 5 through the diode 2 into the source 3 only when Ix is greater than Iy. If Ix is not greater than Iy, an output current of Iy−Ix is to flow out, but this current is blocked by the diode 2, with the result that the output current toward the terminal 5 is zero.

The above relation will be expressed as follows.

$$Iz = \begin{cases} Ix - Iy & (Ix > Iy) \\ 0 & (Ix \leq Iy) \end{cases} \qquad (3)$$

When the membership functions $\mu x$, $\mu y$ are made to correspond to the input currents Ix, Iy, respectively, and the bounded difference $\mu_{x \ominus y}$ to the output current Iz, Expression (3) represents exactly the same relation as Expression (2). It will be understood that the circuit of FIG. 2 is the basic operation circuit for bounded difference.

Figure 3:
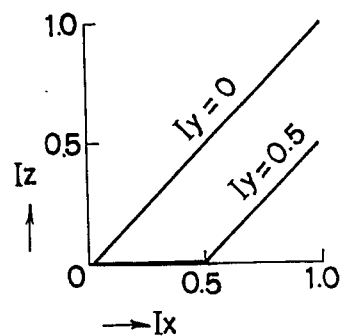
FIG. 3 is a graph showing the input-output characteristics of the same.

FIG. 3 shows the relation between the input current Ix and the output current Iz when the other input current Iy is used as a parameter. In this case, both input and output currents are so normalized that the maximum will be 1.

Figure 5:
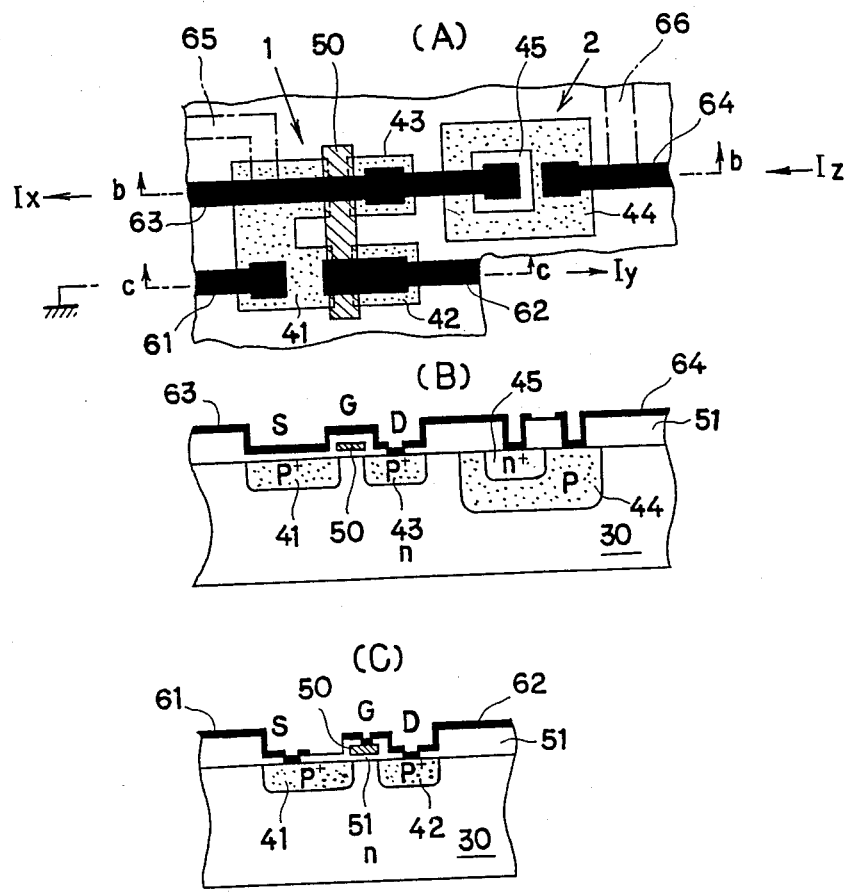
FIGS. 5a, 5b, and 5c shows the construction of an integrated bounded-difference circuit. (A) being a pattern plan view, (B) being a view in section taken along the line b—b in (A), and (C) being a view in section taken along the line c—c in (A)

FIG. 5 shows an example of integrated circuit (IC) structure into which the bounded-difference circuit of FIG. 2 is built. The substrate (second gate) is not shown. The circuit can be formed on an n-type base plate 30 by the common process for fabricating P-MOS.

An Al (conductor) pattern 61 serving as the source of the current mirror 1 is in ohmic contact with a p-region 41. An Al pattern 62 serving as the input drain is connected to a p-region 42. An Al pattern 63 providing the output drain is also connected to a p-region 43. The two FET's are made identical in channel width, channel length and thickness of the gate oxide layer. A polycrystal Si (B dope, p-type) 50 serving as the gate is enclosed by an insulating layer 51 and is positioned between the p-region 41 and p-regions 42, 43. The polycrystal Si 50, which is connected to the Al pattern 62, is insulated from the Al pattern 63 by the layer 51 which is made of SiO$_2$. A p-region 44 and an n-region 45 provide the diode 2. The Al pattern 63 extends over and is connected to the n-region which serves as a cathode. An Al pattern 64 connected to the output terminal 5 is connected to the p-region 44.

Figure 6:
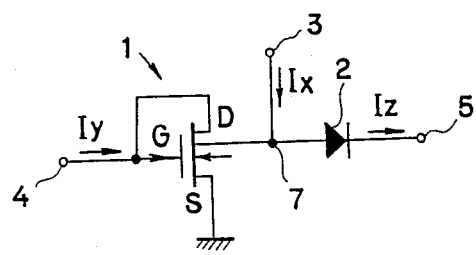
FIG. 6 is a diagram showing a bounded-difference circuit comprising an N-MOS FET.

FIG. 6 shows a bounded-difference circuit provided by an N-MOS FET. The current input-output mode is flow-in input/flow-out output. The FET is also provided with two drains, one connected to the gate and the other to the output side. The source is grounded. The diode 2 is oriented of course in a reverse direction to the one shown in FIG. 2. The operation of Expression (3) can be performed also by this circuit.

In FIG. 6, the current sources are replaced by input terminals 3, 4. For the sake of simplification, this method will be used in the following description of various circuits.

(4) Complement circuit

For the fuzzy set Y, the complement is defined as follows using the membership function $\mu y$ thereof and can be expressed with use of bounded difference.

$$\bar{y} \rightleftharpoons \mu_{\bar{y}} \qquad (4)$$
$$= 1 - \mu y$$
$$= 1 \ominus \mu y$$

A comparison of Expression (4) with Expression (1) or (2) indicates that the complement is bounded difference wherein $\mu x = 1$.

Figure 7:
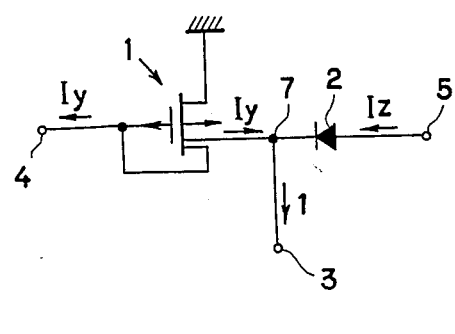
FIG. 7 is a diagram showing a complement circuit.
Figure 8:
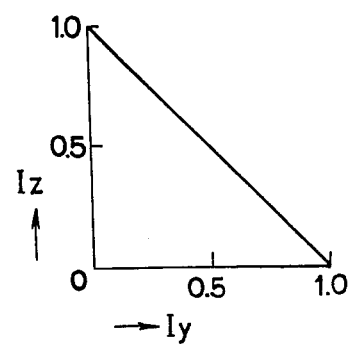
FIG. 8 is a graph showing the input-output characteristics of the same.

Accordingly the complement circuit shown in FIG. 7 corresponds to the circuit of FIG. 2 wherein $Ix = 1$. Accordingly the input current source 3 used is one which produces an input current of value 1 (max). In this case, the current (equal to Iy) flowing out from the output drain can not be greater than the input current 1 of the terminal 3, so that the diode 2 can be omitted. FIG. 8 shows the relation between the input current Iy and the output current Iz involved in the operation of complement.

(5) Bounded-sum circuit

For the fuzzy sets, X, Y, the bounded sum is defined as follows with use of their membership functions $\mu x$, $\mu y$.

$$X \oplus Y \rightleftarrows \mu_{x \oplus y} = \mu x \oplus \mu y = 1 \wedge (\mu x + \mu y) \quad (5)$$

wherein $\oplus$ is bounded sum, $\wedge$ is logic intersection (min) (the smallest is to be selected), and $+$ represents arithmetic summation. Since values exceeding 1 are not used in the fuzzy logic, the bounded sum becomes 1 owing to the logic intersection $\wedge$ if $(\mu x + \mu y)$ is above 1. More specifically, Expression (5) represents the following relation.

$$\mu_{x \oplus y} = \begin{cases} \mu x + \mu y & (\mu x + \mu y < 1) \\ 1 & (\mu x + \mu y \geq 1) \end{cases} \quad (6)$$

The bounded Expression (5) can be expressed as follows.

$$1 \wedge (\mu x + \mu y) = 1 \ominus (1 \ominus (\mu x + \mu y)) \quad (7)$$

Expression (7) can be established in the following manner.

$$1 \ominus (1 \ominus (\mu x + \mu y)) \equiv 1 \ominus (1 \ominus (x + y)) = \quad (8)$$

$$0V(1 - (1 \ominus (x + y))) \, 0V(1 - (0V(1 - x - y))) =$$

$$0V((1 - 0) \wedge (1 - (1 - x - y))) = 0V(1 \wedge (x + y)) =$$

$$1 \wedge (x + y) \equiv 1 \wedge (\mu x + \mu y)$$

Expression (7) indicates that the bounded sum can be calculated by a single arithmetic summation operation and repeating bounded difference operation two times. This further indicates that the bounded-sum circuit can be realized by a single wired OR and two bounded-difference circuits.

Figure 9:
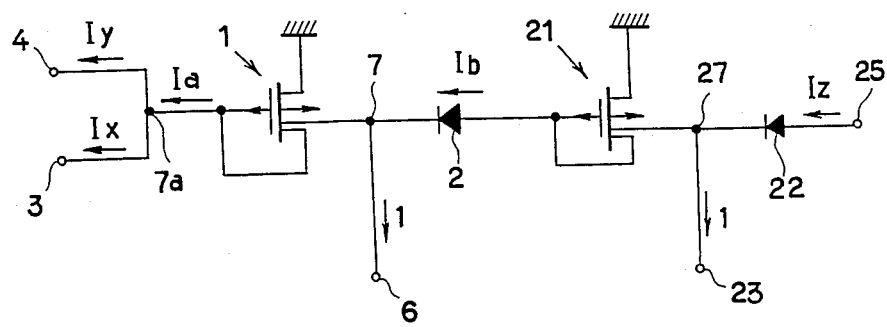
FIG. 9 is a diagram showing a bounded-sum circuit.

FIG. 9 shows a bounded-sum circuit. The arithmetic sum $Ia = Ix + Iy$ of the flow-out input currents Ix and Iy of input terminals 3, 4 is calculated by a wired OR 7a, and the current Ia becpomes an input for the first bounded-difference circuit. Another input terminal 6 of this circuit is given a flow-out input current having the value of 1. Accordingly, the flow-in output current Ib of the first bounded-difference circuit is given by the following expression.

$$Ib = \begin{cases} 1 - Ia = 1 - (Ix + Iy) & (1 > Ix + Iy) \\ 0 & (1 \leq Ix + Iy) \end{cases} \quad (9)$$

The output current Ib serves as an input for the second bounded-different circuit. This circuit in the second stage comprises a current mirror 21, a diode 22 and a wired OR 27 and has niother inputer terminal 23, to which an input current having the value 1 is given. The output terminal 25 of the second-stage circuit has a flow-in output current Iz which is given by:

$$Iz = \begin{cases} 1 - Ib = Ix + Iy & (1 > Ix + Iy) \\ 1 & (1 \leq Ix + Iy) \end{cases} \quad (10)$$

Expression (10) corresponds to Expression (6). It will be understood that the operation for the bounded sum can be executed by the circuit of FIG. 9. The circuit of FIG. 9 can be easily made into an IC by providing the IC pattern of FIG. 5 in two stages.

The currents flowing out from the output drains of the current mirrors 1 and 21 (which currents are equal to Ia and Ib, respectively) can not be greater than the input current 1 of the termihals 6, 23, so that the diodes 2, 22 can be dispensed with. This is advantageous to the present circuit when it is made into an IC.

(6) Bounded-product circuit

For the fuzzy sets X, Y, the bounded product is defined as follows using their membership functions $\mu x$, $\mu y$ and can be expressed with use of the bounded difference.

$$X \cdot Y \rightleftarrows \mu_{x \ominus y} \quad (11)$$
$$= 0V(\mu x + \mu y - 1)$$
$$= (\mu x + \mu y) \ominus 1$$

wherein . represents the bounded product. According to the definition of bounded product by Expression (11), the product is obtained by subtacting 1 from the arithmetic sum of the membership functions $\mu x$ and $\mu y$ and selecting the greater of the subtraction result and 0. More specifically, this indicates the following relation.

$$\mu x \cdot y = \begin{cases} \mu x + \mu y - 1 & (\mu x + \mu y - 1 > 0) \\ 0 & (\mu x + \mu y - 1 \leq 0) \end{cases} \quad (12)$$

Figure 10:
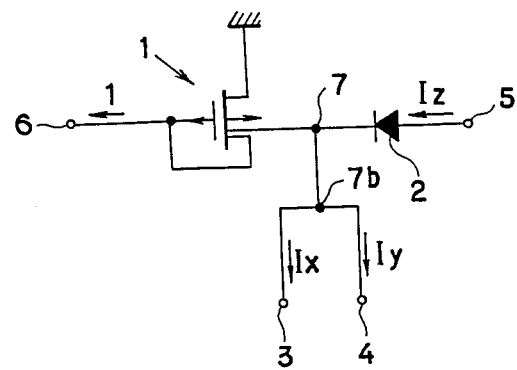
FIG. 10 is a diagram showing a bounded-product circuit.

On the other hand, Expression (11) shows that the operation for the bounded product is performed with use of arithmetic sum and bounded difference. FIG. 10 shows a bounded-product circuit, in which a flow-out input current having a value of 1 is fed to the gate input terminal of a current mirror 1. A wired OR circuit 7b calculates the sum of two input currents Ix and Iy, and the sum current is used as an input for the output drain of the mirror 1. The output current Iz of this circuit is therefore given by:

$$Iz = \begin{cases} Ix + Iy - 1 & (Ix + Iy > 1) \\ 0 & (Ix + Iy \leq 1) \end{cases} \quad (13)$$

Withe Expression (13) corresponding to Expression (12), it is apparent that the circuit FIG. 10 gives the bounded product. The bounded-product circuit of FIG. 10 can be easily made into an IC by providing an Al patterin 65 as connected to the Al pattern 63 in FIG. 5(A).

(7) Logic union circuit (MAX circuit)

For the fuzzy sets X, Y, the logic unit is defined as follows using their membership functions $\mu x$, $\mu y$.

$$X \cup Y \rightleftarrows \mu_{x \cup y} \quad (14)$$
$$\equiv \mu x V \mu y$$

The logic union means that the larger one of $\mu x$ and $\mu y$ is to be selected, so that Expression (14) can be rewritten as follows:

$$\mu_{x \cup y} \begin{cases} \mu x & (\mu x > \mu y) \\ \mu y & (\mu x \leq \mu y) \end{cases} \quad (15)$$

Expression (14) can be modified as follows $$\mu x V \mu y = (\mu x \ominus \mu y) + \mu y = (\mu y \ominus \mu x) + \mu x \quad (16)$$

Expression (16) can be established as follows:

$$\begin{aligned}(\mu x \ominus \mu y) + \mu y &\equiv (x \ominus y) + y \quad (17)\\ &= [0V(x - y)] + y \\ &= (y - 0)V(y + (x - y)) \\ &= y Vx \\ &\equiv \mu y V \mu x \end{aligned}$$

Figure 11:
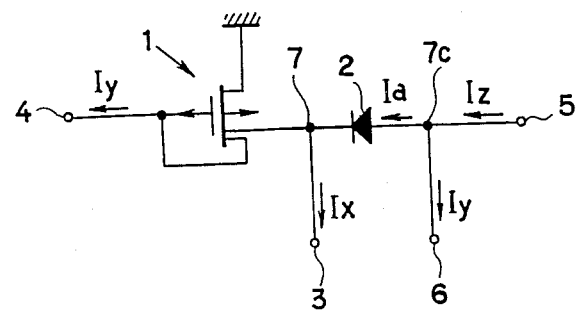
FIG. 11 is a diagram showing a logic union circuit.

Expression (16) shows that the logic union can be calculated by the bounded-difference circuit and wired OR. FIG. 11 shows a logic unit circuit, in which the output current Ia of the bounded-different circuit is given by:

$$Ia = \begin{cases} Ix - Iy & (Ix > Iy) \\ 0 & (Ix \leq Iy) \end{cases} \quad (18)$$

A current Iy is fed to a terminal 6, and current Is and current Iy are added by a wired OR 7c. The final output current Iz, which is given by $Iz = Ia + Iy$, is as follows:

$$Iz = \begin{cases} Ix & (Ix > Iy) \\ Iy & (Ix \leq Iy) \end{cases} \quad (19)$$

By comparing Expression (19) with Expression 15, it is seen that the operation of logic union is performed. The logic union circuit can be obtained in the form of an IC circuit by additionally using an Al pattern 66 as connected to the Al pattern 64 of FIG. 5(A).

As seen in FIG. 11, two current sources are needed for the input (Iy in FIG. 11). Further in FIG. 11, the same result is obtained even when the input currents Ix and Iy are exchanged.

(8) Logic intersection circuit (MIN circuit)

For the fuzzy sets X, Y, the logic intersection is defined as follows using their membership functions $\mu x$, $\mu y$.

$$X \cap Y \rightleftarrows \mu_{x \cap y} \quad (20)$$
$$\equiv \mu x \wedge \mu y$$

Since the logic intersection $\wedge$ means that the smaller of $\mu x$ and $\mu y$ is to be selected, Expression (20) can be rewritten as follows:

$$\mu_{x \cap y} = \begin{cases} \mu y & (\mu x > \mu y) \\ \mu x & (\mu x \leq \mu y) \end{cases} \quad (21)$$

Expression (20) can be modified as follows:

$$\mu_{x \cap y} = \mu x \ominus (\mu x \ominus \mu y) = \mu y \ominus (\mu y \ominus \mu x) \quad (22)$$

Expression (22) can be established as follows:

$$\begin{aligned}\mu x \ominus (\mu x \ominus \mu y) &\equiv x \ominus (x \ominus y) \quad (23)\\ &= 0V[x - (x \ominus y)] \\ &= 0V[x - [0V(x - y)]] \\ &= 0V[(x - 0) \wedge (x - (x - Y))] \\ &= 0V(x \wedge y) \\ &= x \wedge y \\ &\equiv \mu x \wedge \mu y \end{aligned}$$

Figure 12:
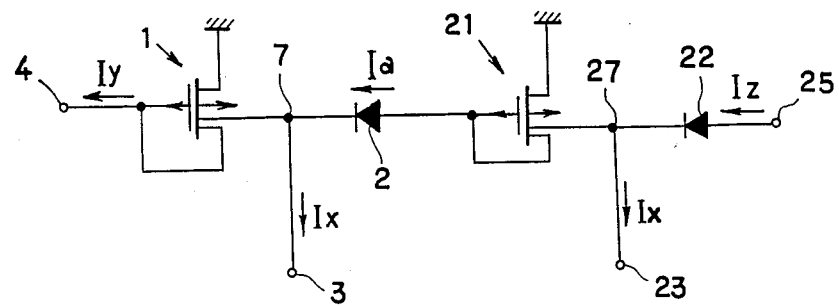
FIG. 12 is a diagram showing a logic intersection circuit.

Expression (20) indicates that the operation for logic intersection can be realized by two bounded-difference circuits. FIG. 12 shows a logic intersection circuit, in which the output current Is of the bounded-difference circuit in the first stage is given by the following Expression.

$$Ia = \begin{cases} Ix - Iy & (Ix > Iy) \\ 0 & (Ix \leq Iy) \end{cases} \quad (24)$$

The current Ia becomes one input current for the bounded difference circuit in the second stage, and Ix is given as the other input current (terminal (23). Accordingly the output current Iz of the second bounded difference circuit is given by the following expression.

$$Iz = \begin{cases} Iy & (Ix > Iy) \\ Ix & (Ix \leq Iy) \end{cases} \quad (25)$$

By making Expression (25) correspond to Expression (21), it is seen that the operation for logic intersection is performed.

Since no current is likely to flow into the gate of the current mirror 21 of the latter-stage bounded-difference circuit, the diode 2 can be omitted.

Figure 13:
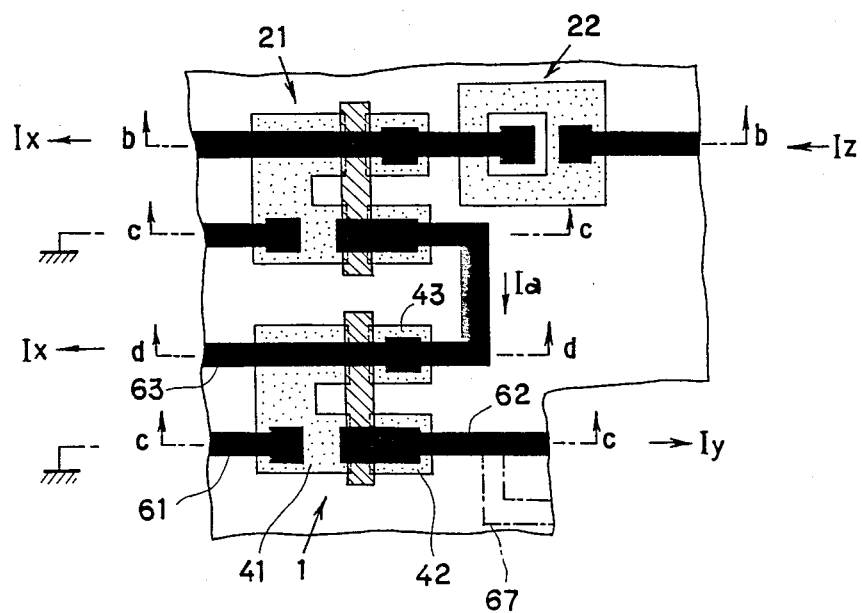
FIG. 13 is an IC pattern plan view of the same.

FIG. 13 shows the logic intersection circuit of FIG. 12 as fabricated into an IC. Since the diode 2 can be omitted from FIG. 12, the diode is omitted from the construction of FIG. 13. Further the IC pattern of the current mirror in the circuit of the first stage is referred to by corresonding reference numerals used in FIG. 5(A). The views in section along the line b—b and line c—c are the same as FIGS. 5(B) and (C) as to the structure shown. The section taken along the line d—d is the same as part of the section shown in FIG. 5(B) (FIG. 17(B)). The current mirror in the first stage is connected to the current mirror in the second stage by Al pattern 63. With reference to FIG. 5, it is seen that the IC pattern of FIG. 13 constitutes the circuit of FIG. 12.

The IC pattern of the bounded-sum circuit (FIG. 9) is obtained by connecting an Al pattern 67 to the Al pattern 62 in FIG. 13.

(9) Absolute-difference circuit

For the fuzzy sets X, Y, the absolute difference is defined as follows with use of their membership functions $\mu x$ and $\mu y$.

$$|X - Y| \quad <> \quad \mu|x - y| \qquad (26)$$
$$\equiv \quad |\mu x - \mu y|$$
$$= \begin{cases} \mu x - \mu y & (\mu x > \mu y) \\ \mu y - \mu x & (\mu x \leq \mu y) \end{cases}$$

Expression (26) can be modified as follows:

$$\mu|x-y| = (\mu x \ominus \mu y) + (\mu y \ominus \mu x) \qquad (27)$$

Expression (27) can be established in the following manner.

$$(\mu x \ominus \mu y) + (\mu y \ominus \mu x) \qquad (28)$$
$$\equiv (x \ominus y) + (y \ominus x)$$
$$= (x \ominus y) + [0V(y - x)]$$
$$= [(x \ominus y) + 0]V[(x \ominus y) + (y - x)]$$
$$= [[0V(x - y)] + 0]V$$
$$\quad [[0V(x - y)] + (y - x)]$$
$$= [(0 + 0)V(0 + x - y)]V$$
$$\quad [(y - x + 0)V(x - y + y - x)]$$
$$= 0V(x - y)V(y - x)V0$$
$$= (x - y)V(y - x)$$
$$\equiv (\mu x - \mu y)V(\mu y - \mu x)$$

Figure 14:
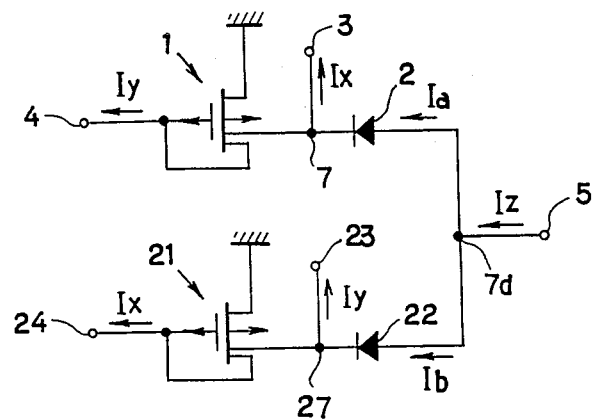
FIG. 14 is a diagram showing an absolute-difference circuit.

Expression (27) indicates that the operation of the absolute difference can be realized by two bounded-difference circuits and one wired OR. FIG. 14 shows an absolute-difference circuit. With reference to this drawing, the output current Is of one bounded-difference circuit including a current mirror 1 and a diode 2 is given by:

$$Ia = \begin{cases} Ix - Iy & (Ix > Iy) \\ 0 & (Ix \leq Iy) \end{cases} \qquad (29)$$

In the other bounded-difference circuit including a current mirror 21 and a diode 22, the input currents Ix and Iy thereof are exchanged with those of the above-mentioned one circuit, so that the output current thereof, Ib, is given by:

$$Ib = \begin{cases} 0 & (Ix > Iy) \\ Iy - Ix & (Ix \leq Iy) \end{cases} \qquad (30)$$

The output current Iz of the absolute-difference circuit, which is arithmetic sum of the output currents Ia and Ib, is as follows:

$$Iz = Ia + Ib \qquad (31)$$

$$= \begin{cases} Ix - Iy & (Ix > Iy) \\ Iy - Ix & (Ix \leq Iy) \end{cases}$$

By making Expression (31) correspond to Expression (26), it will be understood that the operation of absolute difference is performed.

Figure 15:
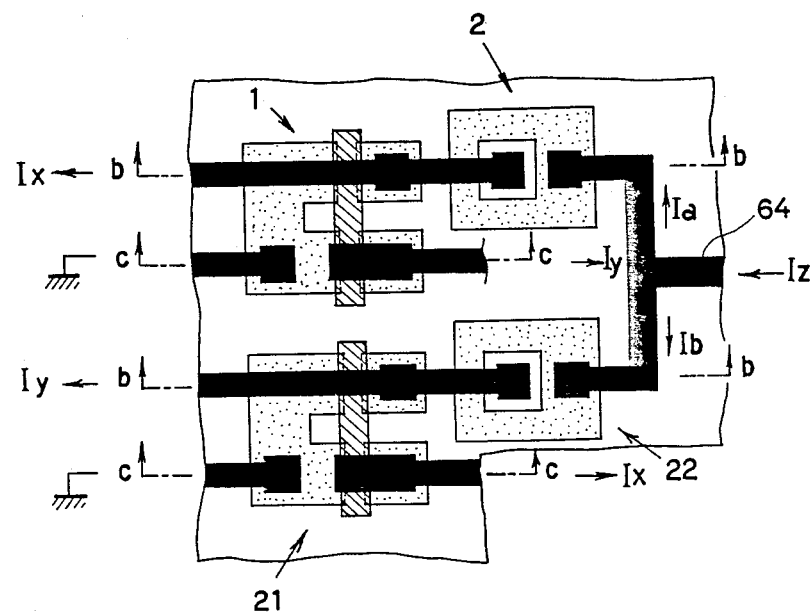
FIG. 15 is an IC pattern plan view of the same.

FIG. 15 shows the absolute-difference circuit of FIG. 14 as fabricated into an IC. Since two diodes 2 and 22 can not be omitted, the Ic of FIG. 15 comprises two bounded-difference IC's such as the one shown in FIG. 5, and Al patterns 64 connected to the anodes of the diodes 2, 22 and connected to each other to give an output. The b—b section and c—c section are the same as those shown in FIGS. 5(B) and (C).

(10) Implecation circuit

For the fuzzy sets X, Y, the implecation is defined as follows by their membership functions $\mu x$, $\mu y$.

$$X \to Y \rightleftharpoons \mu_{x \to y} \equiv 1 \wedge (1 - \mu x + \mu y) \qquad (32)$$

Since $\mu x$ represents the degree of belonging to the set X, $(1 - \mu x)$ represents the degree of not belonging to the set X. Further for the logic intersection $\wedge$, the smaller is to be selected. In view of the above, implication represents the arithmetic sum of the above two kinds of degrees, and means that when the sum is greater than 1, 1 is taken as the result. For a better understanding, Expression (32) will be modified as follows:

$$1 \wedge (1 - \mu x + \mu y) \qquad (33)$$

$$= \begin{cases} 1 - \mu x + \mu y & (\mu x > \mu y) \\ 1 & (\mu x \leq \mu y) \end{cases}$$

Further Expression (32) can also be modified as follows:

$$1 \wedge (1 - \mu x + \mu y) = 1 \ominus (\mu x \ominus \mu y) \qquad (34)$$

Expression (34) can be established as follows:

$$1 \ominus (\mu x \ominus \mu y) \equiv 1 \ominus (x \ominus y) = 0V[1 - (x \ominus y)] = \qquad (35)$$
$$0V[1 - [0V(x - y)]] = 0V[(1 - 0) \wedge (1 - (x - y))] =$$
$$0V[1 \wedge (1 - x + y)] = 1 \wedge (1 - x + y) \equiv 1 \wedge (1 - \mu x + \mu y)$$

Figure 16:
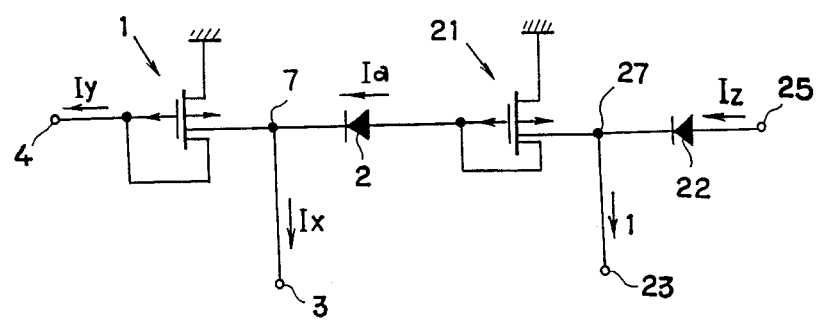
FIG. 16 is a diagram showing an implication diagram.

Expression (34) shows that the operation for the implication can be realized by two bounded-difference circuits. FIG. 16 shows an implication circuit. With reference to the diagram, the output current Ia of the bounded-difference circuit in the first stage is given by:

$$Ia = \begin{cases} Ix - Iy & (Ix > Iy) \\ 0 & (ix \leq Iy) \end{cases} \quad (36)$$

This current Is serves as one input current for the bounded-difference circuit in the second stage, while a curring having a value of 1 is given as the other input current (terminal 23). Accordingly the output current Iz of the second circuit is given by:

$$Iz = \begin{cases} 1 - Ix + Iy & (Ix > Iy) \\ 1 & (Ix \leq Iy) \end{cases} \quad (37)$$

By making Expression (37) correspond to Expression (33) it is seen that the operation for the implecation is performed.

Figure 17:
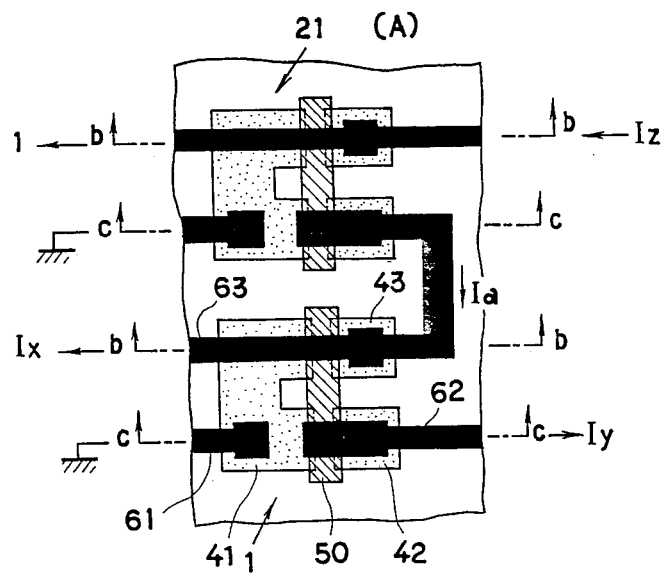
FIGS. 17a and 17b show an IC pattern of the same, (A) being a plan view, and (B) being a view in section taken along the line b—b in (A)
Figure 17:
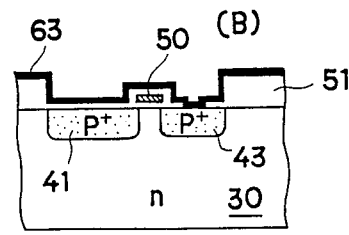

With reference to FIG. 16, the diode 2 can be omitted for the same reason as in the case of the logic intersection circuit (FIG. 12). Because the current (equal to Ia) flowing out from the output drain of the current mirror 21 in the second stage is unlikely to become greater than the input current 1 of the terminal 23, the diode 22 can also be omitted. Accordingly, when the implication circuit of FIG. 16 is to be made into an IC, the diodes 2, 22 need not be provided as shown in FIG. 17(A). In FIG. 17(A), the c—c section is the same as the one shown in FIG. 5(B).

(11) Equivalence circuit

For the fuzzy sets X, Y, the equivalence is defined as follows using their membership functions $\mu x$, $\mu y$.

$$X \rightleftarrows Y \rightleftarrows \mu_{x \rightleftarrows y} \quad (38)$$
$$\equiv \mu_{x \to y} \wedge \mu_{y \to x}$$

Since the equivalence is thus expressed by the smaller of the two equivalences $\mu_{x \to y}$ and $\mu_{y \to x}$, the above definition (33) of equivalence can be utilized to express the equivalence as follows:

$$\mu_{x \rightleftarrows y} = \begin{cases} 1 - \mu x + \mu y & (\mu x > \mu y) \\ 1 - \mu y + \mu x & (\mu x \leq \mu y) \end{cases} \quad (39)$$

Expression (39) can be modified as follows:

$$\mu_{x \rightleftarrows y} = 1 \ominus ((\mu x \ominus \mu y) + (\mu y \ominus \mu x)) \quad (40)$$

Expression (40) can be established as follows:

$$X \rightleftarrows Y \equiv (X - Y) \wedge (Y - X) \equiv (x \ominus y) \wedge (y \ominus x) \equiv \quad (41)$$
$$(x \ominus y) \vee (y \ominus x) = Ix - yI = 1 - Ix - yI =$$
$$1 - ((x \ominus y) + (y \ominus x)) = 1 \ominus ((x \ominus y) + (y \ominus x))$$

Figure 18:
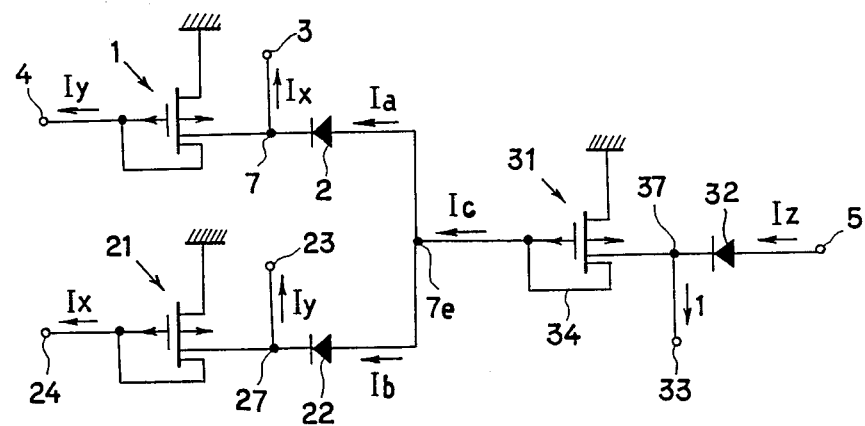
FIG. 18 is a diagram showing an equivalence circuit.

Expression (40) shows that the equivalence operation can be performed by three bounded-differece circuits and one wired OR. FIG. 18 shows an equivalence circuit. A first bounded-difference circuit including a current mirror 1 and a second bounded-difference circuit including a current mirror 21 are connected in parallel (wired OR 7e). The two parallel circuits connected together provide the aforementioned absolute-difference circuit. Accordingly the output current Ic thereof is expressed as follows with reference to Expression (31).

$$Ic = \begin{cases} Ix - Iy & (Ix > Iy) \\ Iy - Ix & (Ix \leq Iy) \end{cases} \quad (42)$$

A third bounded-difference circuit comprises a current mirror 31, a diode 32 and a wired OR 37. One of the input current is the above output current Ic, and the other input current (input terminal 33) is a current having a value of 1. Accordingly, the output current Iz of the third circuit is given by:

$$Iz = \begin{cases} 1 - (Ix - Iy) & (Ix > Iy) \\ 1 - (Iy - Ix) & (Ix \leq Iy) \end{cases} \quad (43)$$

A comparison of Expression (43) with Expression (39) indicates that the equivalent operation is executed.

With reference to Expression (43), when Ix=Iy, (Ix−Iy)=(Iy−Ix)=0, so that Iz=1. Thus, when the two input currents Ix and Iy are equal, the output current Ix has a value of 1. If otherwise, Iz≠1. Accordingly, when giving attention only to whether the output current Ix is 1 or not, the equivalence circuit can be considered as a matching circuit.

As will be apparent from Expression 42, the current Ic represents the difference between Ix and Iy. When Ix=Iy, Ic=0. Further when the short circuit 34 is opened in the current mirror 31, the element serves merely as a single FET, which is off only when Ic=0. Since flow-out current of value 1 is given to the input terminal 33, Iz=1 when the FET is off. When FET is on (Ic≠0), the flow-out input current of the input terminal 33 flows through the FET, with the result that Iz=0. It will be understood that the circuit of FIG. 18 becomes a a matching circuit with a binary output (current mode) when the short circuit 34 is opened.

Further the current (=Ic) flowing out from the output drain of the current mirror 31 has no likelihood of becoming greater than the input current 1 of the terminal 33, so that the diode 32 can be omitted.

Figure 19:
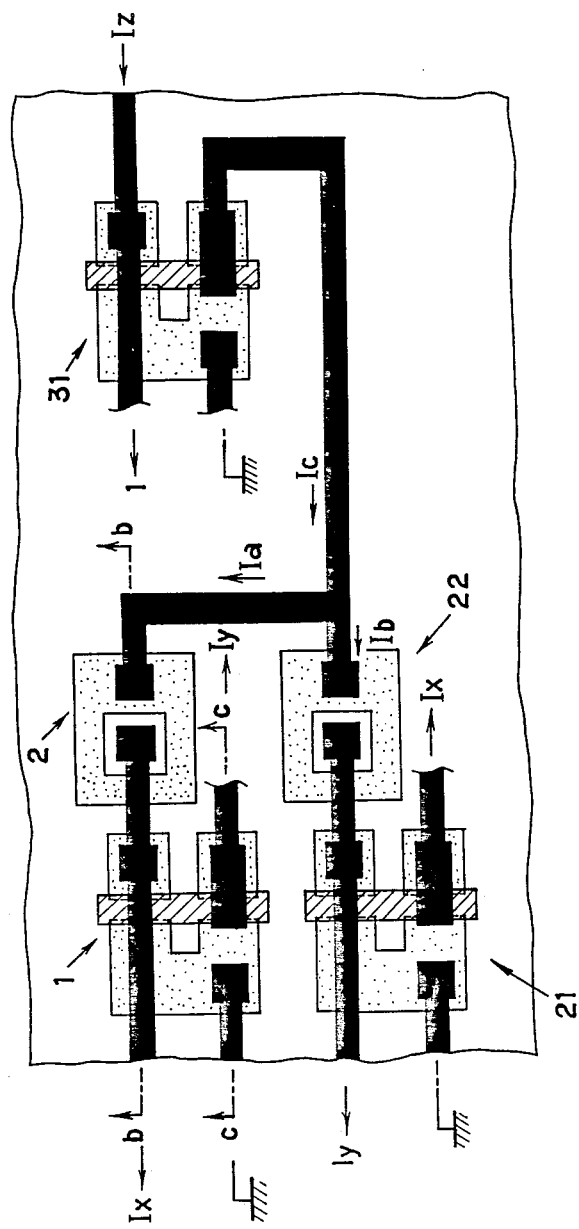
FIG. 19 is an IC pattern plan view of the same.

FIG. 19 shows the circuit of FIG. 18 as fabricated into an IC. In the equivalence circuit, the diode 32 can be omitted, but the diodes 2 and 22 can not be omitted. Accordingly the IC base is provided thereon with two bounded difference circuits comprising a current mirror and a diode, and another current mirror. The sections taken along the line b—b and the line c—c are the same as those shown in FIGS. 5(B) and (C), respectively.

(12) Current distributor circuit

The bounded-sum circuit (FIG. 9) requires two current sources having a value of 1. Similarly, the logic union circuit (FIG. 11), logic intersection circuit (FIG. 12), absolute-difference circuit (FIG. 14) and equivalence circuit (FIG. 18) require two current sources for the input currents Ix and Iy. Current distributors are useful when currents of the same value in the same direction are necessary. The distributor is readily available based on the concept of the current mirror. In the case of the current mirror of FIG. 4 (A), as also apparent from the IC of FIG. 5, the base plate is provided thereon with two drains, a common source and a common gage, and one of the drains is connected to the common gate. When the base plate has thereon at least three drains one of which is connected to a common gate (multi-output current mirror), currents of a value equal to the gate current (input drain current) are available at the same time from at least two other drains. Such a multi-output current mirror can be represented as seen FIG. 20. The example shown in FIG. 20 delivers four outputs.

Figure 21:
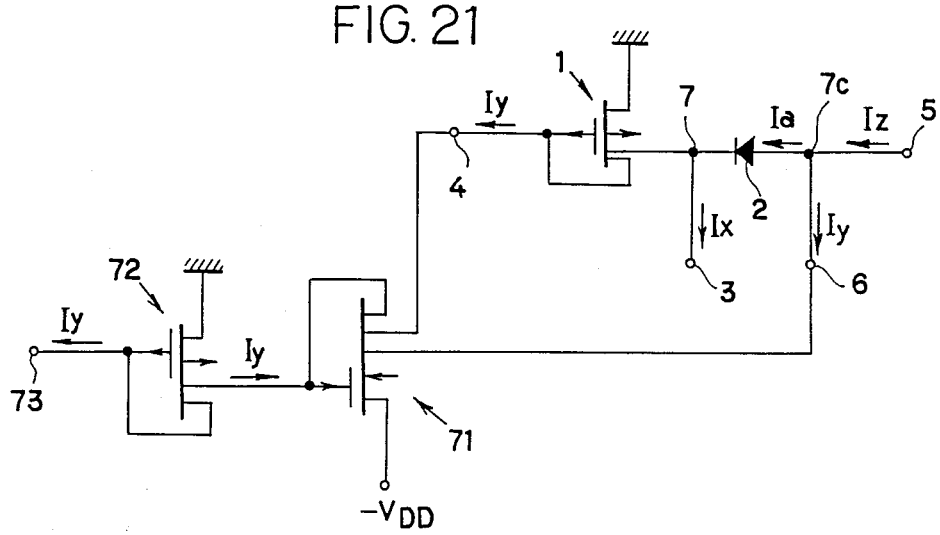
FIG. 21 a diagram showing a logic union circuit incorporating a current distributor.

FIG. 21 shows a current distributor as used for the logic union circuit (FIG. 11). With the logic union circuit, the current Iy (flow-out input) must be fed to two terminals 4 and 6. Accordingly, the flow-out input current Iy of a terminal 73 is converted to a flow-in input current Iy by a current mirror 72. This flow-in input is fed to a multi-output current mirror 71 for giving two flow-out input currents Iy. The mirror 71 comprises an N-MOS FET.

(13) Multiple fan-out circuit

Figure 22:
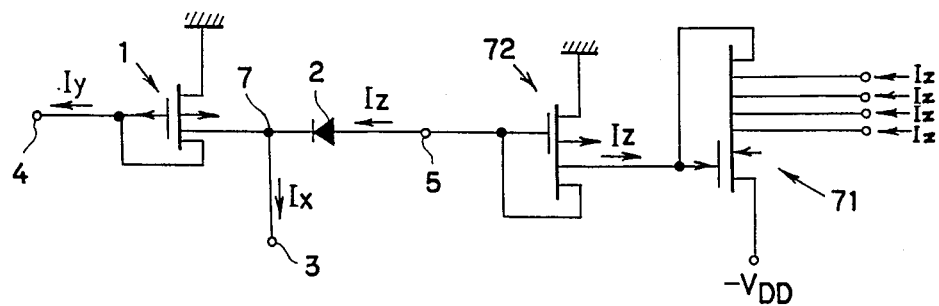
FIG. 22 is a diagram showing a bounded-difference circuit including a current distributor.

The multi-output current mirror is usable for giving a multiplicity of outputs of the same value. FIG. 22 shows an embodiment wherein the above-mentioned current mirror 72 and multi-output current mirror 71 (with a different number of output terminals) are used for the bounded-difference circuit of FIG. 2. It is seen that a single flow-in output current Iz affords four flow-in output currents Iz. The circuit composed of the mirrors 71 and 72 produces a plurality of output currents of the same value in the same direction as the input current and is therefore substantially a current distributor. For the sake of discrimination, a circuit for producing a plurality of currents in the same direction as the input current is called a "current distributor," while a circuit which produces a plurality of output currents in a reverse direction to the input current is termed a "multiple fan-out circuit" (multi-output mirror).

(14) Multi-output bounded-difference circuit

Figure 23:
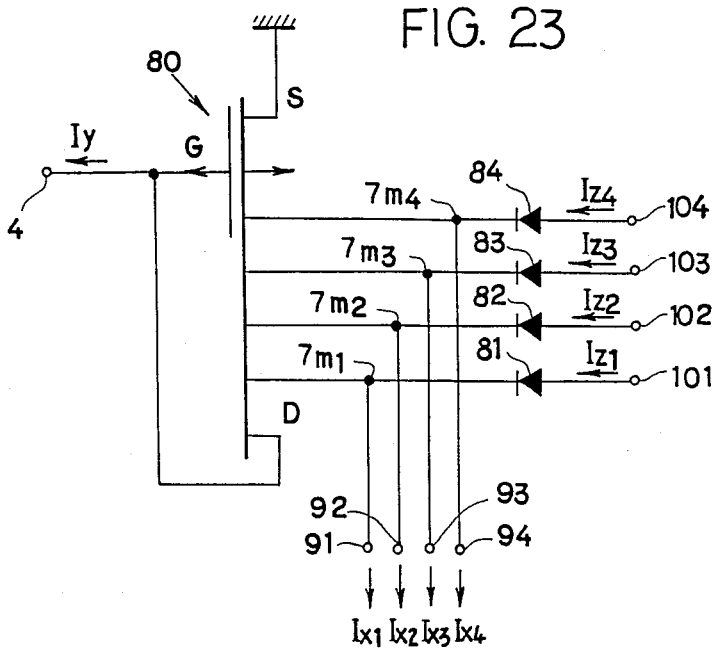
FIG. 23 is a diagram showing a multi-output bounded-difference circuit.

The multiple fan-out circuit can be further developed into a multi-output bounded-difference circuit as seen in FIG. 23. A multi-output current mirror 80 (for giving four outputs for a simplified description) has output drains which are connected to wired OR 7m1 to 7m4 each at one input portion thereof. These wired OR's 7m1 to 7m4 are connected, each at the other input portion thereof, to input terminals 91 to 94 and have an output side connected to output terminals 101 to 104 via diodes 101 to 104. The input currents to the input terminals 91 to 94 are indicated at Ix1 to Ix4, and the output currents of the output terminals 101 to 104 at Iz1 to Iz4. In corresponding relation to Expression (3), the following output currents are obtained.

$$Izn = \begin{cases} Ixn - Iy & (Ixn > Iy) \\ 0 & (Ixn \leq Iy) \end{cases} \quad (44)$$

where n = 1 to 4.

The circuit of FIG. 23 performs operation for four kinds of bounded differences at the same time. This means that when the membership function $\mu y$ is definite and the other membership function $\mu xn$ is variable, the operation for $\mu xn \ominus y$ can be performed for a multiplicity of values $\mu xn$ at the same time. This means an increased operation speed and means that scanning of $\mu xn$ with time can be omitted.

If Ix1=Ix2=Ix3=Ix4=I, the circuit of FIG. 23 is equivalent to the circuit of FIG. 22.

The multi-output bounded-difference circuit of FIG. 23 can be fabricated into an IC with the structure shown in FIG. 24. An n-type base plate 30 is provided thereon with a p-region 110, with which an Al pattern 146 pattern 146 is in ohmic contact, whereby a source is formed for a multi-output current mirror 80. The p-region 110 has five projections. Five other p-regions 111 to 115 are opposed to the projections as spaced apart therefrom a suitable distance. The channels formed between the projections of the p-region 110 and the p-regions 111 to 115 are identical in width and length. A polycrystal Si portion 50 serving as a gate is so disposed as to oppose the space between the p-region projections and the p-regions 111 to 115. Connected to the Si 50 is an Al pattern 145 providing an input drain. The Al pattern 145 is in ohmic contact with the p-region 115. Diodes 81 to 84 comprise p-regions 121 to 124 and n-regions 131 to 134, respectively. Al patterns 141 to 144 are connected to the n-regions 131 to 134, respectively. Al patterns 151 to 154 connected to output terminals 101 to 104, respectively, are connected to the p-regions.

Figure 20:
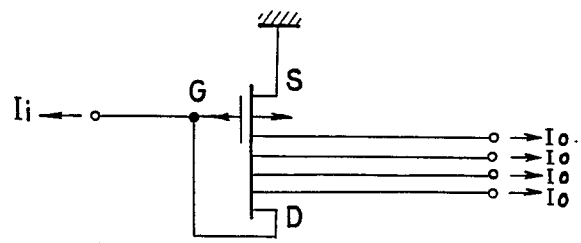
FIG. 20 is a circuit diagram showing a multi-output current mirror.
Figure 25:
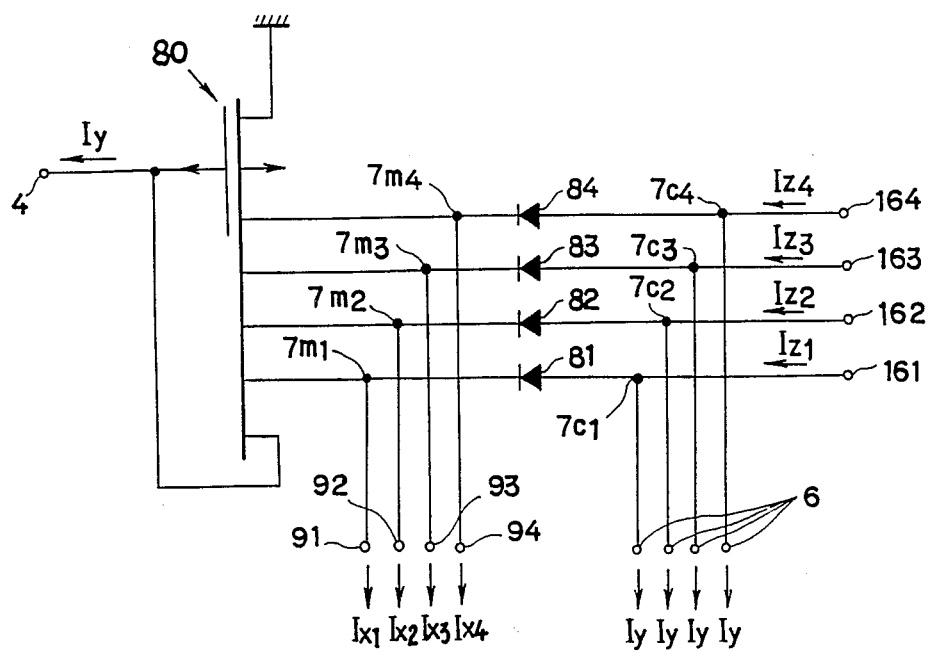

FIG. 25 shows a multi-output bounded-difference circuit as used for the logic union of FIG. 11. The bounded-difference circuit of FIG. 11 composed of the current mirror 1, diode 2 and wired OR 7 is replaced by the multi-output bounded-difference circuit shown in FIG. 23. Input terminals 6 for supplying an input current Iy are connected (wired OR's 7c1 to 7c4) to the anodes of diodes 81 to 84. Input currents Iy of equal value can be supplied to four input terminals 6 and input terminals 4 with use of the above current distributor (FIG. 20). It will be readily understood with reference to Expression 19 that output terminals 161 to 164 deliver a logic union output which is given by the following expression.

$$Iz = Ixn \, V \, Iy = \begin{cases} Ixn & (Ixn > Iy) \\ Iy & (Ixn \leq Iy) \end{cases} \quad (45)$$

wherein x = 1 to 4.

The multi-output bounded-difference circuit is of course usable without the diodes 81 to 84 (FIG. 23).

(15) IC circuits consisting essentially of bonded-difference circuit

As already described, the basic operation circuit for the fuzzy logic can be composed of a bounded-difference circuit and a wired OR in combination. Accordingly, if a base plate has formed there on a logic array of bounded difference circuits in advance, a desired fuzzy logic operation circuit can be realized by designing an Al wiring pattern only.

Figure 26:
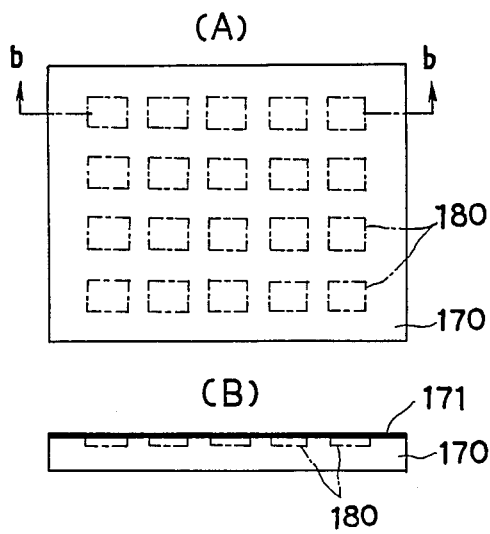
FIGS. 26a and 26b show an example of fuzzy IC, (A) being a plan view schematically showing the arrangement of the same, and (B) being a view in section taken along the line b—b in (A)

FIG. 26 shows a prefabricated IC having a multiplicity of basic circuit 180 formed on a base plate 170. Provided over the upper surface of the IC is a protective insulating film or layer formed with contact holes at suitable portions. A thin Al film 171, which is a conductor, is further formed over the protective film by vacuum evaporation. The upper surface of the IC may be entirely covered with a protective insulating film only instead of the combination of the two films. In principle, the basic circuit 180 is the basic element of the bounded-difference circuit (i.e. the circuit with the wiring removed therefrom). Since the diode preceding the current mirror can be omitted as already stated, the basic element of the current mirror (i.e. the mirror from which the wiring has been removed) is usable as the basic circuit 180. These two kinds of elements may be used.

For example, the manufacturer prepares such semifinished IC's to the user, who works on the IC by one to three steps to obtain a desired fuzzy logic circuit with use of a suitable wiring pattern. Thus, it is possible for the user to construct the desired logic circuit or system easily.

Figure 27:
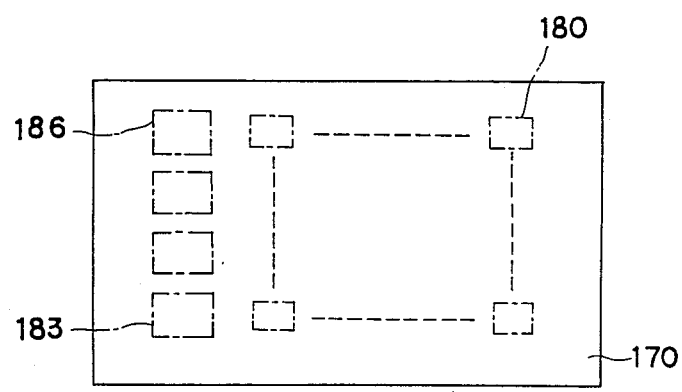
FIG. 27 is a plan view schematically showing another example.

Preferably, one base plate 170 is provided, in addition to base circuits 180, with a current distributor or multiple fan-out circuits 183 and 186 as seen in FIG. 27.

Figure 28:
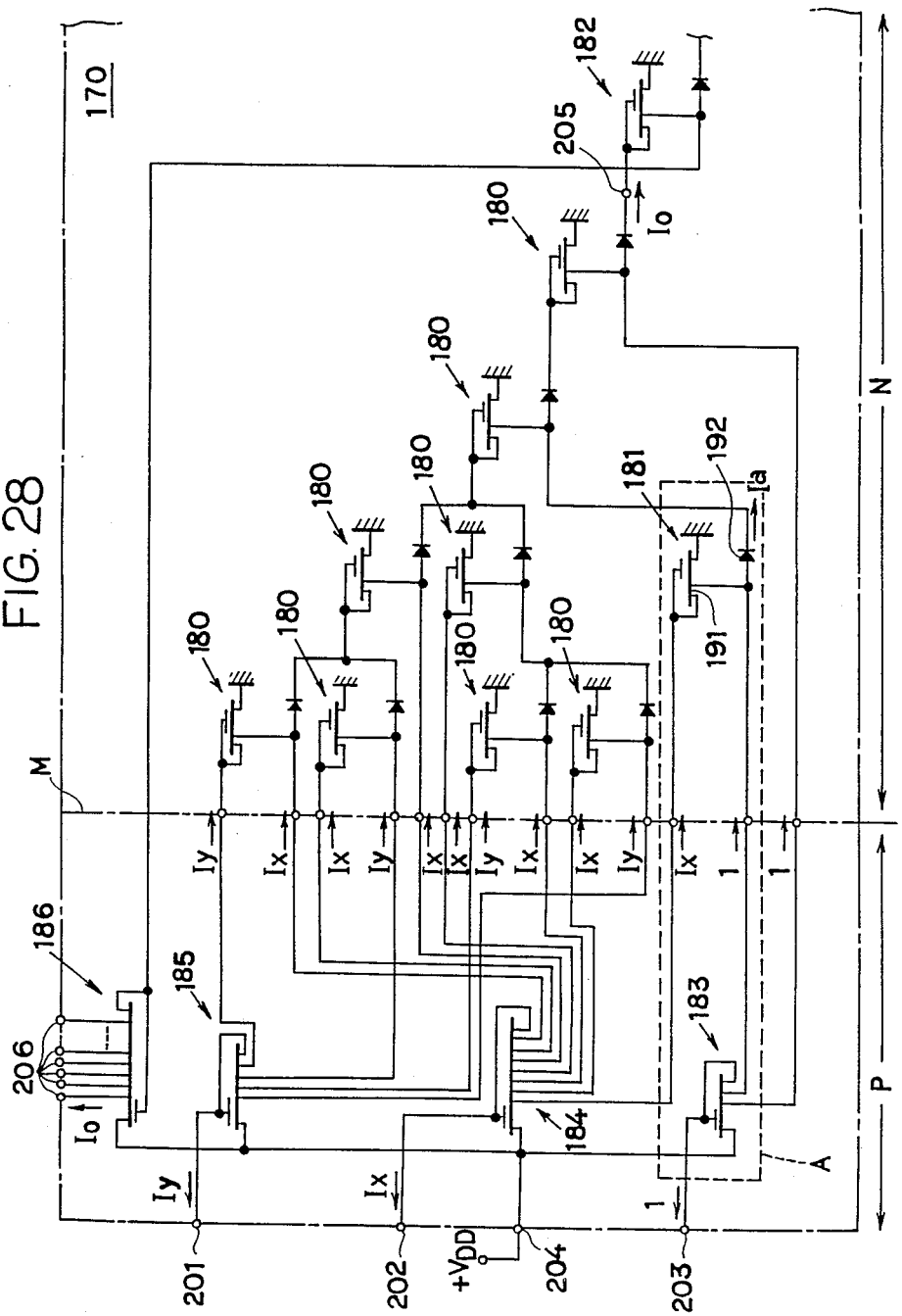
FIG. 28 is a diagram showing an example of fuzzy logic circuit.

FIG. 28 shows an example of fuzzy logic circuit which is prepared from a semifinished IC having a current distributor and multiple fan-out circuits as seen in FIG. 27 by wiring the components. Input currents Iy, Ix and a current with a value of 1 are given to input terminals 201, 202 and 203, respectively. A multiple fan-out circuit 185 provided on the base plate 170 produces a multiplicity of currents of a value equal to the input current Iy. Similarly, multiple fan-out circuits 184 and 183 produce currents of values equal to Ix and 1, respectively. Power supply voltage plus VDD is applied to a terminal 204 and further applied to the circuits 183 to 185.

Many bounded-difference circuits 180, 181 or the base plate 170, when suitably wired, provide a fuzzy logic circuit having a specified function (in the present case, not particularly limited). The output current of the multiple fan-out circuits 183 to 185 are fed to the fuzzy logic circuit, which delivers an output current Io at an output terminal 205 (not a specified terminal such as one for wiring bonding). The output current Io, which is flow-out output, is converted to a flow-in output with use of the current mirror of the circuit 182. The diode of the circuit 182 serves no function whatever. The cathode of the diode is left open. The flow-in output of the circuit 182 is fed to a multiple output circuit, by which a multiplicity of output currents Io having the same value are obtained. The output currents Io are delivered from terminals 206.

The circuits 183 to 186 comprise P-MOS, while the circuits 180 to 182 comprise N-MOS. In this way, various kinds of circuits can be provided on one base plate 170. It is of course possible to divide the assembly along a broken line M to provide the multiple fan-out circuits on one portion of the plate, and the bounded-difference circuits on the other portion.

Figure 29:
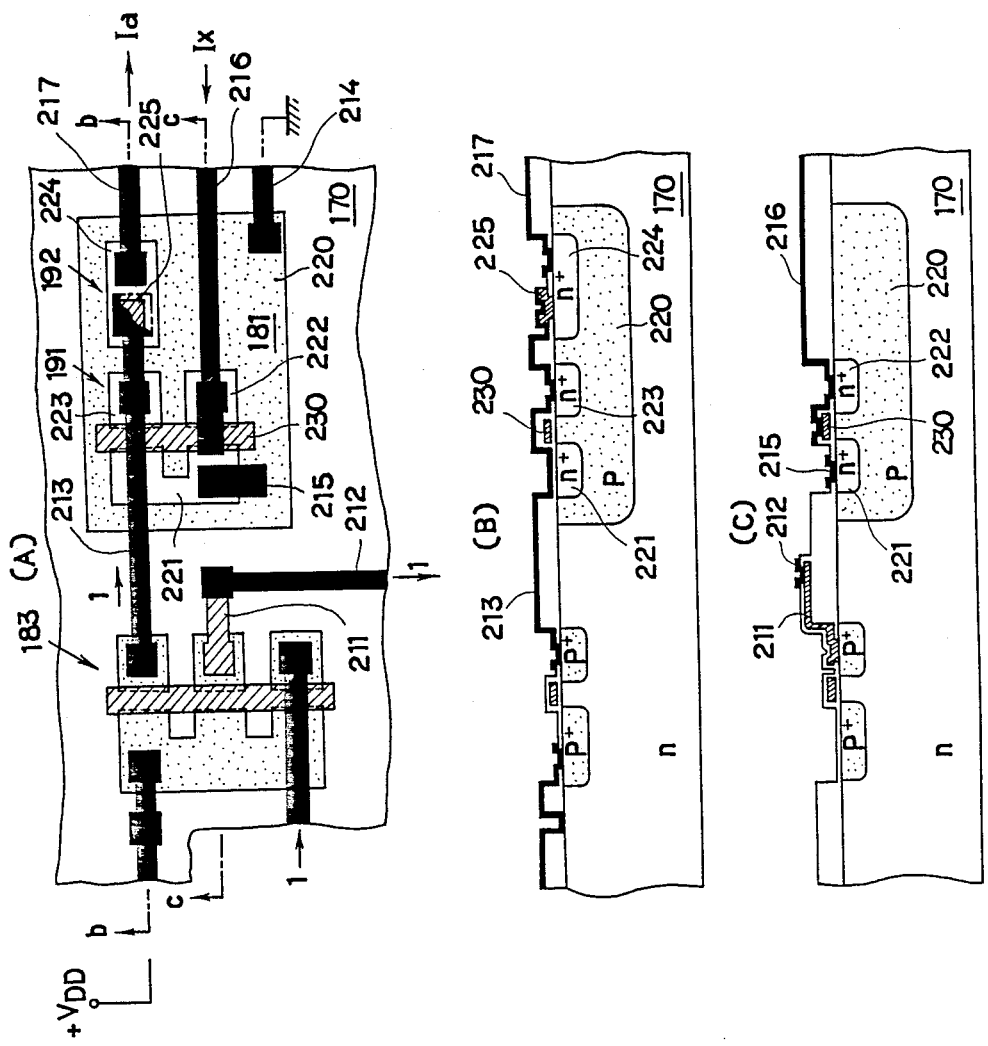
FIGS. 29a, 29b, and 29c show part of an IC pattern therefor, (A) being a pattern plan view of the same partly broken away, and (B) and (C) are views in section taken along the line b—b and the line c—c, respectively, in (A).

FIG. 29 shows a part of the circuit shown in FIG. 28, i.e. the portion enclosed by a broken line A and including the multiple fan-out circuit 183 and the bounded-difference circuit 181 in the form of an IC pattern. The IC is fabricated by polysilicon gate self-alignment P-MOS process. The base plate is of n-type. The circuit 183 has substantially the same construction as the multi-output current mirror indicated at 80 in FIG. 24 (A) except that one output drain comprises a double layer wiring of polysilicon 211 and Al pattern 212. The other output drain is connected to the circuit 181 by an Al pattern 213.

The bounded-difference circuit 181 is provided within a p-region 220, which is grounded by an Al pattern. An n-region 221 is connected to the p-region 220 by an Al pattern 215, constituting the source of the mirror 191. One of other n-regions, i.e. one indicated at 223, is connected to the Al pattern 213 (drain), while the other 222 is connected to polycrystal Si 230 serving as a gate and to an input A1 pattern 216 (drain). A diode 192 comprises an n-region and n-type polycrystal Si 225. The polycrystal Si 225 is connected to the Al pattern 213, and the n-region 224 to an output Al pattern 217.

What is claimed is:

1. A fuzzy logic semifinished integrated circuit comprising:
   a base plate,
   a multiplicity of identical basic circuit elements fabricated on the base plate for constructing desired fuzzy logic circuits operable in a current mode in selected combinations of the basic circuit elements, each of the basic circuit elements comprising a non-wired current mirror which is connectable to construct a bounded-difference circuit with use of connection patterns, each of said fuzzy logic circuits comprising at least one said bonded-difference circuit, and
   an insulating film formed over the entire surface of the base plate for insulating said basic circuit elements from said connection patterns except for conducting positions of said basic circuit elements.

2. A fuzzy logic circuit as in claim 1, wherein said insulating film is a protective insulating film.

3. A fuzzy logic circuit as in claim 1, wherein said insulating film is formed with contact holes at least at said conducting positions, and a thin conductor film for realizing said connection patterns is formed over the insulating film.

4. A fuzzy logic circuit as in claim 1, wherein the basic circuit elements each comprise a said current mirror and a non-wired diode, said insulating film is formed with contact holes at least at said conducting positions, and a thin conductor film for realizing said connection patterns is formed over the insulating film.

5. A fuzzy logic circuit as in claim 1, wherein the basic circuit elements each comprise a said current mirror and a non-wired diode, from said insulating film is a protective insulating film.

6. A fuzzy logic semifinished integrated circuit comprising:
   a base plate,
   a non-wired current distributor circuit and a non-wired multi-output circuit fabricated on the base plate,
   said non-wired multi-output circuit having at least three drain regions, one of which is connectable to a common gate, and a common source region, wherein each of said drain regions feeds a current of the same value as that of an input current fed to said source region, and
   an insulating film formed over the entire surface of the base plate.

7. A fuzzy logic circuit as in claim 6, wherein said insulating film is a protective insulating film.

8. A fuzzy logic circuit as in claim 6, wherein said insulating film is formed with contact holes at predetermined positions, and a thin conductor film is formed over the insulating film, wherein the current distributor circuit and multi-output circuit are operable in a current mode when they are connected by the conductor film.

9. A fuzzy logic circuit as in claim 6, further comprising a current distributor non-wired circuit comprising said non-wired multi-output circuit and a non-wired current mirror.

* * * * *

UNITED STATES PATENT AND TRADEMARK OFFICE
CERTIFICATE OF CORRECTION

PATENT NO. : 4,860,243
DATED : August 22, 1989
INVENTOR(S) : UENO et al.

It is certified that error appears in the above-identified patent and that said Letters Patent is hereby corrected as shown below:

ON TITLE PAGE:

Foreign Application Priority Data:

Please change in all instances "Mar. 23, 1987" to -- Mar. 23. 1984 --.

Signed and Sealed this

Seventeenth Day of December, 1991

Attest:

HARRY F. MANBECK, JR.

*Attesting Officer*    Commissioner of Patents and Trademarks